United States Patent
Okayama et al.

(10) Patent No.: US 7,172,962 B2
(45) Date of Patent: Feb. 6, 2007

(54) METHOD OF MANUFACTURING A SEMICONDUCTOR DEVICE

(75) Inventors: Yoshio Okayama, Ogaki (JP); Hayato Nakashima, Gifu (JP); Yoshinari Ichihashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/724,111

(22) Filed: Dec. 1, 2003

(65) Prior Publication Data
US 2004/0110370 A1 Jun. 10, 2004

(30) Foreign Application Priority Data
Nov. 29, 2002 (JP) ............................. 2002-347094

(51) Int. Cl.
*H01L 21/4763* (2006.01)
*H01L 21/44* (2006.01)

(52) U.S. Cl. ...................... 438/625; 438/626; 438/627; 438/629; 438/631; 438/632; 438/633; 438/637; 438/643; 438/645; 438/646; 438/648; 438/653; 438/656; 438/660; 438/663; 438/669; 438/672; 438/674; 438/675; 257/E21.304

(58) Field of Classification Search ........ 438/625–627, 438/629, 631–633, 637, 643, 645–646, 648, 438/653, 656, 660, 663, 669, 672, 674–675, 438/685, 687, 692, 700
See application file for complete search history.

(56) References Cited

U.S. PATENT DOCUMENTS

| | | | | |
|---|---|---|---|---|
| 6,051,500 A | * | 4/2000 | Maury et al. | 438/692 |
| 6,117,782 A | * | 9/2000 | Lukanc et al. | 438/692 |
| 6,380,078 B1 | * | 4/2002 | Liu et al. | 438/638 |
| 6,605,542 B2 | * | 8/2003 | Seta et al. | 438/700 |
| 6,693,036 B1 | * | 2/2004 | Nogami et al. | 438/692 |
| 6,756,672 B1 | * | 6/2004 | You et al. | 257/751 |
| 6,838,355 B1 | * | 1/2005 | Stamper et al. | 438/409 |
| 2003/0203624 A1 | * | 10/2003 | Sameshima et al. | 438/687 |

FOREIGN PATENT DOCUMENTS

| | | |
|---|---|---|
| JP | 2002-203898 | 7/2002 |
| JP | 2002-208633 | 7/2002 |

\* cited by examiner

*Primary Examiner*—Michael Lebentritt
*Assistant Examiner*—Mohsen Ahmadi
(74) *Attorney, Agent, or Firm*—McDermott Will & Emery LLP (57) ABSTRACT

On a substrate are sequentially formed a first interconnection 203, a diffusion barrier film 205 and a second insulating film 207, and on the upper surface of the second insulating film 207 is then formed a sacrificial film 213. Next, a via hole 211 and an interconnection trench 217 are formed, and on the sacrificial film 213 are then formed a barrier metal film 219 and a copper film 221. CMP for removing the extraneous copper film 221 and barrier metal film 219 are conducted in a two-step process, i. e., the first polishing where polishing is stopped on the surface of the barrier metal film 219 and the second polishing where the remaining barrier metal film 219 and the tapered sacrificial film 213 are polished.

20 Claims, 8 Drawing Sheets

METHOD OF MANUFACTURING A SEMICONDUCTOR DEVICE

This application is based on Japanese patent application NO. 2002-347094, the content of which is incorporated hereinto by reference.

BACKGROUND OF THE INVENTION

1. Field of the Invention

This invention relates to a method of manufacturing a semiconductor device. In particular, it relates to a method of manufacturing a semiconductor device comprising damascene interconnections.

2. Description of the Related Art

Recently, copper having a lower specific resistance has been often used as a material for an interconnection in a semiconductor device. Since it is difficult to perform reactive ion etching on copper, the damascene process is usually employed for forming the interconnection when using copper as the interconnect material. Known damascene processes include a single damascene process in which an interconnection layer and a via hole are stepwise formed and a dual damascene process in which an interconnection layer and a via hole are simultaneously formed. Among these, a dual damascene process, disclosed in JP-A No. 2002-203898 for example, is advantageous in the light of reduction in the number of steps because the via hole and the interconnection trench are simultaneously buried. The via hole may be made of the same type of copper as that for the interconnection to reduce a resistance of the via hole.

Forming an interconnection structure using a dual damascene process can be conducted by a via-first or trench-first process. In a via-first process, a via hole is first formed and an interconnection trench is then formed such that the trench is superposed over the via hole pattern. On the other hand, in a trench-first process, an interconnection trench is first formed and a via hole is then formed such that the via hole is superposed over the trench. The former is advantageous in the light of ensuring good contact performance of the via hole. Now referring to FIGS. 1A to 1D and 2A to 2D, conventional via-first steps of the dual damascene process will be described below.

Figure 1A:
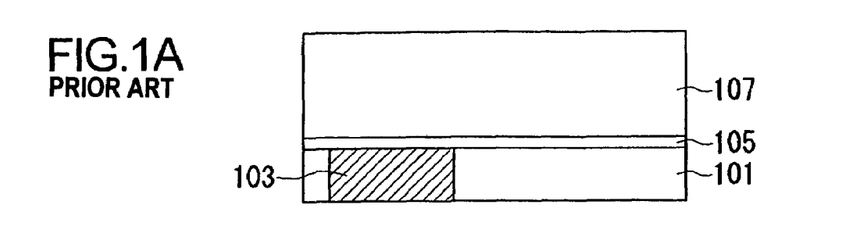
FIGS. 1A to 1D are process cross sections illustrating a process for manufacturing a semiconductor device of the related art.

FIG. 1A shows the step in which a first interconnection 103, diffusion barrier film 105 and a second insulating film 107 are sequentially formed on a substrate (not shown in the drawings). After depositing a first insulating film 101 on the substrate, an interconnection trench is formed by dry etching and then a barrier metal film (not shown in the drawings) and a copper film are formed in sequence such that the trench is filled with them. Then, extraneous barrier metal and copper films formed outside of the interconnection trench are removed by CMP (Chemical Mechanical Polishing), to form the first interconnection 103. Next, on the first interconnection 103 is formed the diffusion barrier film 105. The diffusion barrier film 105 is formed for preventing copper from diffusing into the insulating film and is also used as an etching stopper film during forming a via hole 111. Then, on the diffusion barrier film 105 is formed the second insulating film 107.

The second insulating film 107 is an interlayer insulating film having a lower dielectric constant. Thus, the structure of FIG. 1A is provided.

Figure 1B:
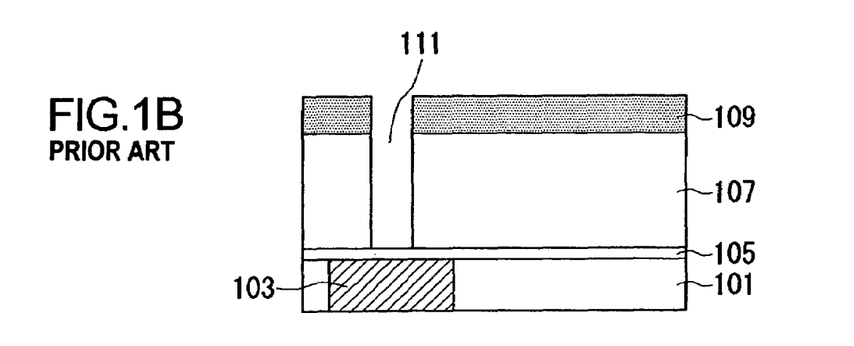

Then, as shown in FIG. 1B, on the second insulating film 107 are sequentially formed an anti-reflection film (not shown in the drawings) and a resist film 109, and a resist pattern for the via hole 111 is formed by lithography. Then, the via hole 111 is formed by dry etching. During the process, etching is stopped on the diffusion barrier film 105, utilizing a difference in an etching rate between the second insulating film 107 and the diffusion barrier film 105 for preventing copper contamination due to exposure of the first interconnection 103, ashing after etching and damage to the copper during a washing procedure. After etching, the resist film 109 and the anti-reflection film are removed by ashing.

Figure 1C:
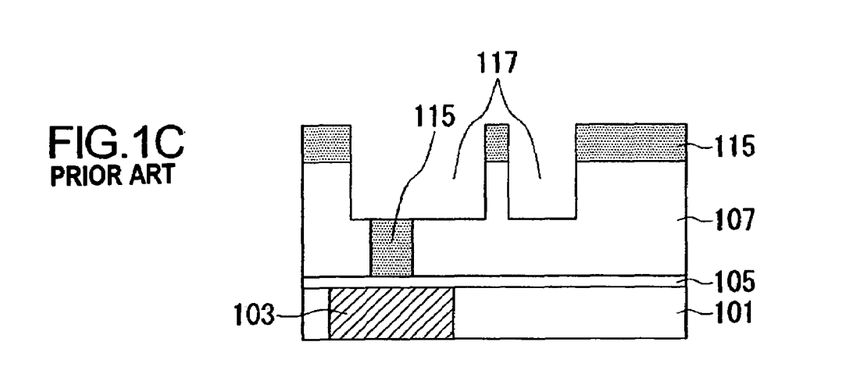

Then, as shown in FIG. 1C, on the second insulating film 107 are sequentially formed an anti-reflection film (not shown in the drawings) and a resist film 115, and then a resist pattern for the interconnection trench 117 is formed as described above. Then, the interconnection trench 117 is formed by dry etching. During the process, the bottom of the via hole 111 is not etched because the anti-reflection film or the resist film 115 is buried.

Figure 1D:
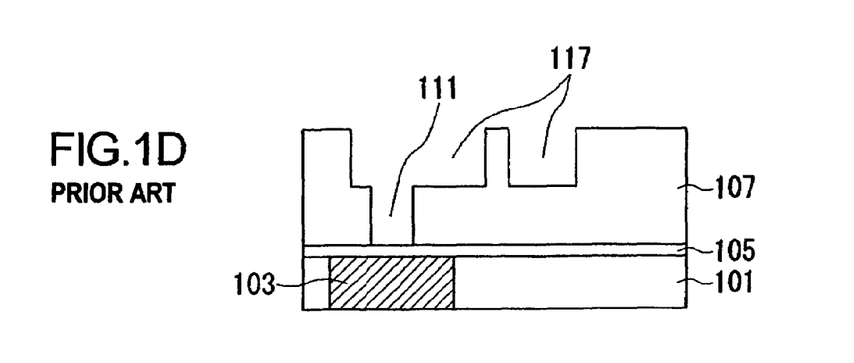
Figure 2A:
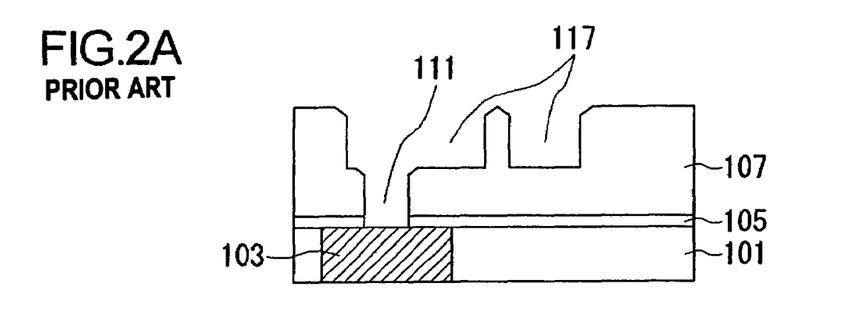
FIGS. 2A to 2D are process cross sections illustrating a process for manufacturing a semiconductor device of the related art.

Then, as shown in FIG. 1D, the resist film 115 and the anti-reflection film are removed by ashing. Next, as shown in FIG. 2A, the diffusion barrier film 105 in the bottom of the via hole 111 is removed by dry etching to expose the first interconnection 103.

Figure 2B:
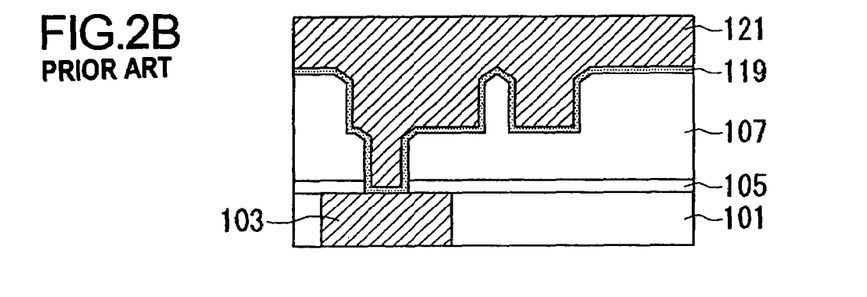

Then, as shown in FIG. 2B, a barrier metal film 119 and a copper film (not shown in the drawings) to be a seed layer for electroplating are sequentially formed by sputtering over the whole surface of the second insulating film 107 including the via hole 111 and the interconnection trench 117. Subsequently, a copper film 121 is buried in the via hole 111 and the interconnection trench 117 by electroplating.

Figure 2C:
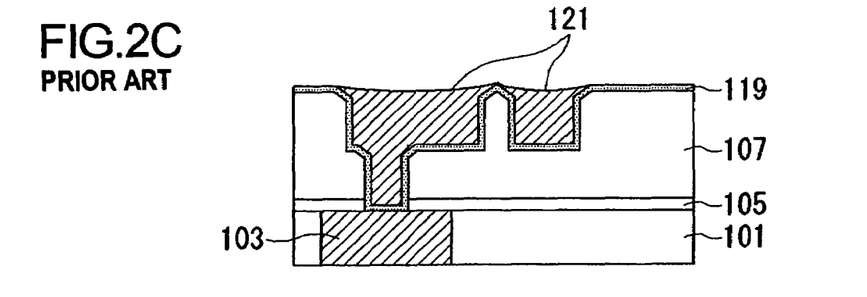
Figure 2D:
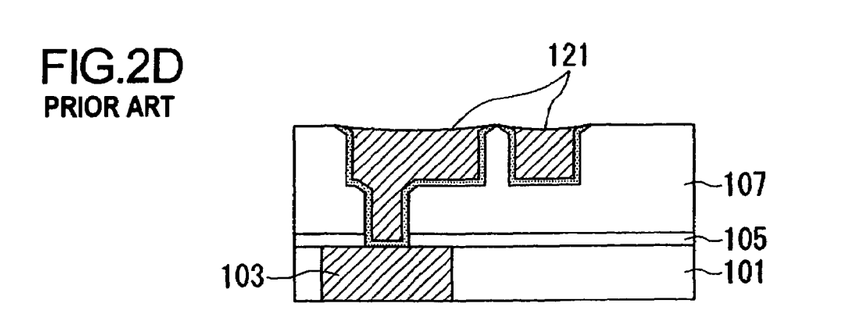

Then, as shown in FIGS. 2C and 2D, the extraneous copper film 121 and barrier metal film 119 are removed by CMP.

As described above, there are formed the copper film 121, i. e., the second interconnection in the interconnection trench 117, and the via hole connecting the first interconnection 103 with the second interconnection.

SUMMARY OF THE INVENTION

However, we have found a new problem after investigating the process shown in FIGS. 1A to 1D and 2A to 2D. Specifically, it has been found that during etching of the diffusion barrier film 105 in the bottom of the via hole 111 shown in FIG. 2A, etching is relatively faster in the corner of the second insulating film 107, in the upper part of the interconnection trench 117, so that the film is etched in the form of a normal taper, as shown in FIG. 2A. Thus, in an interval between fine interconnections, a distance in the upper part of the interconnection trench 117 is further reduced, causing a parasitic capacitance and also short circuit failure.

In view of the problems, an objective of this invention is to provide a method of manufacturing a semiconductor device in which a parasitic capacitance is inhibited between metal films such as interconnections, plugs and pads. Another object of this invention is to provide a method of manufacturing a semiconductor device in which short circuit is inhibited between metal films such as interconnections, plugs and pads.

According to the present invention, there is provided a method of manufacturing a semiconductor device comprising: forming an insulating film on a semiconductor substrate, forming a concave in the insulating film and then forming a metal film filling the concave; conducting a first polishing over the whole surface of the substrate to form a metal area filled in the concave; and conducting a second polishing over the whole surface of the substrate to remove parts of the metal area and of the insulating film; wherein the second polishing also removes a part of the normal taper formed in the upper part of the concave.

According to the manufacturing method of this invention, the method comprises removing a part of the normal taper formed in the upper part of the concave so that a parasitic capacitance or short circuit failure between metal areas can be prevented in the normal taper.

According to the present invention, there is provided a method of manufacturing a semiconductor device comprising: forming an insulating film on a semiconductor substrate, forming a concave in the insulating film and then forming a metal film filling the concave; conducting a first polishing over the whole surface of the substrate to form a metal area filled in the concave; and conducting a second polishing over the whole surface of the substrate to remove parts of the metal area and of the insulating film; wherein the second polishing also removes at least a part of the normal taper formed in the upper part of the concave.

For example, for a semiconductor device comprising a lower interconnection on the substrate, the normal taper formed in the upper part of the concave before removing the extraneous metal film is often formed during exposing the lower interconnection.

According to the present invention, there is provided a method of manufacturing a semiconductor device comprising: forming a first interconnection of a metal film on a semiconductor substrate; forming an insulating film covering the first interconnection; selectively removing the insulating film to form a via hole reaching the upper surface of the first interconnection and an interconnection trench connected to the via hole; forming a metal film filling the via hole and the interconnection trench; conducting a first polishing over the whole surface of the substrate to form a second interconnection filled in the via hole and the interconnection trench as well as a connection plug; and conducting a second polishing over the whole surface of the substrate to remove parts of the second interconnection and of the insulating film; wherein the second polishing also removes at least a part of a normal taper formed in the upper part of the second interconnection trench.

The above method according to this invention comprises removing at least a part of the normal taper formed in the upper part of the interconnection trench so that a parasitic capacitance or short circuit failure between metal films filling the concave can be, therefore, also reliably and effectively prevented in a dual damascene process.

According to the present invention, there is provided a method of manufacturing a semiconductor device comprising: forming an insulating film on a semiconductor substrate; forming a sacrificial film on the insulating film; removing the sacrificial film and the insulating film in sequence to form a concave in the insulating film and then forming a metal film filling the concave; conducting a first polishing over the whole surface of the substrate to form a metal area filled in the concave; and conducting the second polishing over the whole surface of the substrate to remove parts of the metal area and of the insulating film; wherein the second polishing also remove the sacrificial film.

The above method according to this invention comprises forming the sacrificial film on the insulating film and then removing the sacrificial film so that the normal taper formed in the upper part of the concave can be reliably removed. A parasitic capacitance or short circuit failure between metal films filling the concave can be, therefore, reliably and effectively prevented.

In the methods of manufacturing a semiconductor device according to this invention, forming the concave in the insulating film may comprise conducting etching under the etching conditions in which the sacrificial film is more slowly etched than the insulating film. Etching under the above conditions can reduce a size of the taper formed in the upper part of the concave. Thus, it results in thinner polishing in the second polishing so that short circuit failure between interconnections can be much more effectively prevented.

Etching conditions include, for example, the type of the insulating film, the type of an etching gas and a bias-voltage value. Specifically, when using an organic film as an insulating film and a gas containing hydrogen and nitrogen as an etching gas, a material for a sacrificial film is preferably $SiO_2$ which is etching-resistant to the gas.

According to the present invention, there is provided a method of manufacturing a semiconductor device comprising: forming a first interconnection of a metal film on a semiconductor substrate; forming an insulating film such that it covers the first interconnection; forming a sacrificial film on the insulating film; selectively removing the insulating film and the sacrificial film in sequence to form a via hole reaching an upper surface of the first interconnection and an interconnection trench connected to the via hole; forming a metal film filling the via, hole and the interconnection trench; conducting a first polishing over a whole surface of the substrate to form a second interconnection and a connection plug filled in the hole and the interconnection trench; and conducting a second polishing over the whole surface of the substrate to remove parts of the second interconnection and of the insulating film; wherein the second polishing also remove the sacrificial film on the insulating film.

In a dual damascene process, a parasitic capacitance or short circuit failure between metal films filling a concave can be reliably and effectively prevented by forming the sacrificial film on the insulating film and removing it.

In the method of manufacturing a semiconductor device according to this invention, removing at least a part of the normal taper formed in the upper part of the concave may be conducted before removing parts of the metal area and of the insulating film. Thus, the normal taper formed in the upper part of the concave can be more reliably removed.

In the method of manufacturing a semiconductor device according to this invention, forming the via hole and the interconnection trench in the insulating film may comprise conducting etching under the etching conditions in which the sacrificial film is more slowly etched than the insulating film.

Etching under the above conditions can reduce a size of the taper formed in the upper part of the interconnection trench. Thus, it results in thinner polishing in the second polishing so that short circuit failure between interconnections can be much more effectively prevented.

In the method of manufacturing a semiconductor device according to this invention, an information on a polishing rate in the second polishing may be obtained and on the basis of the information, the end point of the second polishing may be determined.

The manufacturing method according to this invention comprises obtaining information on a polishing rate in the second polishing and conducting polishing for a period determined on the basis of the information, so that a polishing thickness can be controlled. Thus, the normal taper formed in the upper part of the concave can be more reliably removed.

In the method of manufacturing a semiconductor device according to this invention, a thickness of the insulating film polished along with the metal area may be observed to determine the end point of the second polishing.

The manufacturing method according to this invention comprises conducting polishing while observing a thickness of the insulating film polished, so that a thickness of the insulating film polished can be controlled. Thus, the normal taper formed in the upper part of the metal area can be further reliably removed.

This summary of the invention does not necessarily describe all necessary features so that the invention may also be a sub-combination of these described features.

DETAILED DESCRIPTION OF THE INVENTION

The invention will now be described based on the preferred embodiments. This does not intend to limit the scope of the present invention, but exemplify the invention.

In these embodiments, polishing is conducted such that a taper formed in the upper part of the interconnection trench is removed, to prevent a parasitic capacitance or short circuit failure between metal areas. Preferred embodiments will be described with reference to the drawings.

First Embodiment

Figure 3A:
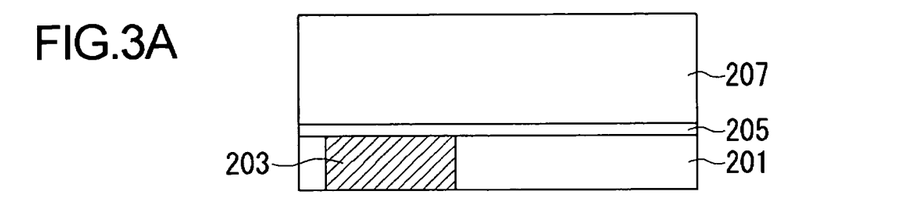
FIGS. 3A to 3D are process cross sections illustrating a process for manufacturing a semiconductor device according to an embodiment of this invention.

FIGS. 3A to 3D and 4A to 4D are process cross sections illustrating a process for manufacturing a semiconductor device according to this embodiment. FIG. 3A shows the step of forming a first insulating film 201, a first interconnection 203 in the first insulating film 201, a diffusion barrier film 205 and a second insulating film 207 on a substrate (not shown in the drawings) in sequence.

The structure in FIG. 3A is formed as described below. On a substrate is deposited a first insulating film 201 and an interconnection trench is formed by dry etching. Then, barrier metal and copper films (not shown in the drawings) are sequentially formed such that the inside of the trench is filled with them. Then, the extraneous barrier metal and the copper films formed outside of the interconnection trench is removed by CMP to form a first interconnection 203. Next, on the first interconnection 203 is formed the diffusion barrier film 205. The diffusion barrier film 205 is formed for preventing copper as a material for the first interconnection 203 from diffusing into the insulating film and for being used as an etching stopper film during formation of a via hole 211. On the diffusion barrier film 205 is formed a second insulating film 207. Thus, the structure in FIG. 3A is formed.

The first interconnection 203 may be made of Al, W or TiN in place of Cu. The diffusion barrier film 205 may be made of, for example, SiC or SiN. A thickness of the diffusion barrier film 205 is, for example, 25 nm to 100 nm both inclusive.

The second insulating film 207 is made of, for example, SiOC having a specific dielectric constant of 3.5 or less. SiOC is sometimes represented as SiOCH and generally contains Si, O, C and H as constituent elements. The second insulating film 207 may be formed by an appropriate method such as CVD. Other examples of a material which can be used include a variety of materials having a lower dielectric constant; for example, hydrogenated siloxane (HSQ), methylsiloxane (MSQ), hydrogenated methylsiloxane (MHSQ), polyimide (PI), perfluorocarbon (PFC), aromatic ether (PAE), aromatic hydrocarbon (PAHC) and benzocyclobutene (BCB) and their derivatives. A film made of any of these materials can be formed by an appropriate method such as CVD or spin coating. A thickness of the second insulating film 207 is, for example, 500 nm to 2000 nm both inclusive.

Figure 3B:
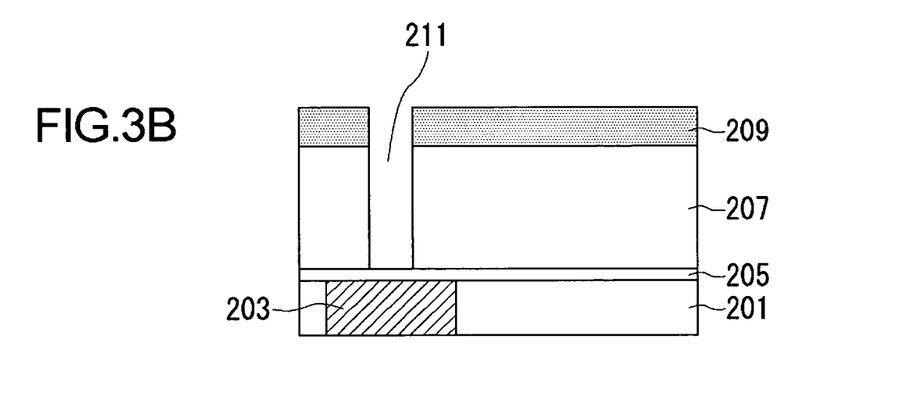

Next, as shown in FIG. 3B, on the second insulating film 207 are sequentially formed an anti-reflection film (not shown in the drawings) and a resist film 209, and then a resist pattern for a via hole 211 is formed by lithography. Then, a via hole 211 is formed by dry etching. During the process, etching is stopped on the diffusion barrier film 205, utilizing a difference in an etching rate between the second insulating film 207 and the diffusion barrier film 205 for preventing metal contamination due to exposure of the first interconnection 203, ashing after etching, and damage to the metal during a washing procedure. After etching, the resist film 209 and the anti-reflection film are removed by ashing.

Figure 3C:
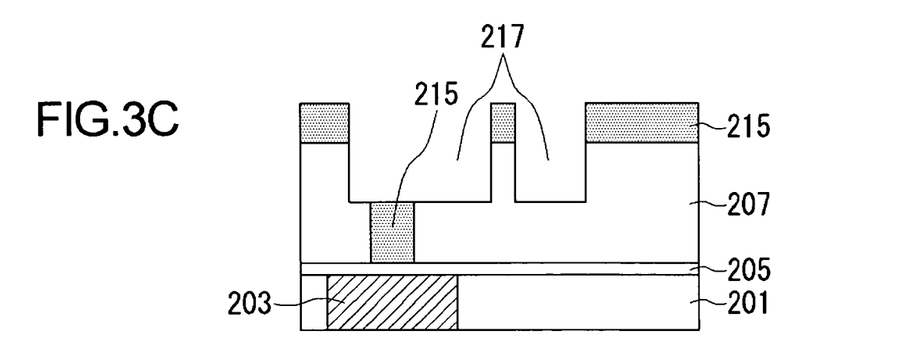

Then, as shown in FIG. 3C, on the second insulating film 207 are sequentially formed an anti-reflection film (not shown in the drawings) and a resist film 215, and then a resist pattern for the interconnection trench 217 is formed as described above. Then, the interconnection trench 217 is formed by dry etching. During the process, the bottom of the via hole 211 is not etched because the anti-reflection film or the resist film 215 is buried.

Figure 3D:
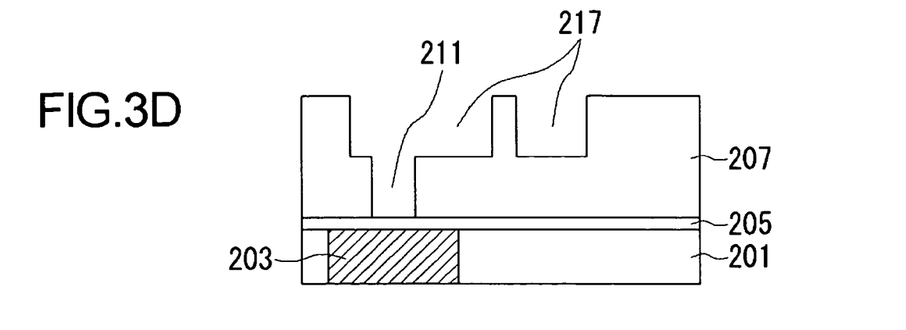

Then, as shown in FIG. 3D, the resist film 215 and the anti-reflection film are removed by ashing. Next, as shown in FIG. 4A, the diffusion barrier film 205 in the bottom of the via hole 211 is removed to expose the first interconnection 203.

Figure 4A:
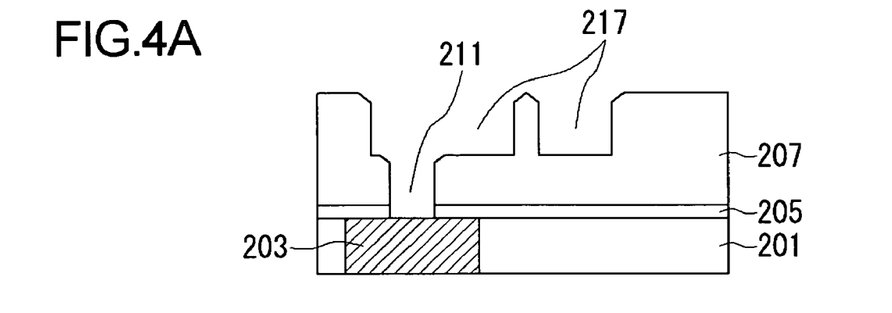
FIGS. 4A to 4D are process cross sections illustrating a process for manufacturing a semiconductor device according to an embodiment of this invention.

In the process, as shown in FIG. 4A, an etching rate in the upper part of the interconnection trench 217 is higher so that the upper part of the interconnection trench 217 is etched in a form of a normal taper.

Figure 4B:
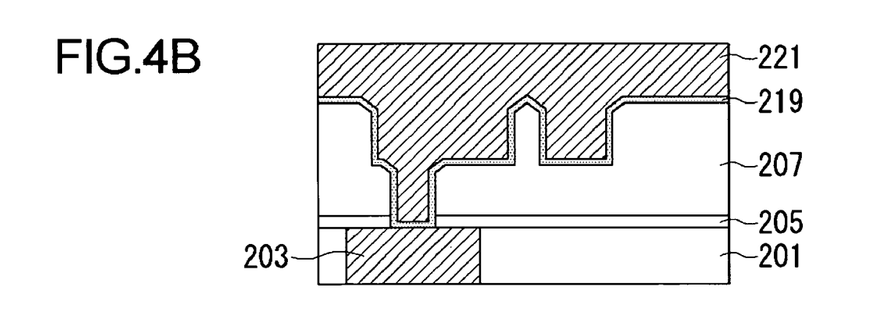

Then, as shown in FIG. 4B, a barrier metal film 219 and a copper film (not shown in the drawings) to be a seed layer for electroplating are sequentially formed by sputtering over the whole surface of the second insulating film 207 including the via hole 211 and the interconnection trench 217. The barrier metal film 219 may be made of, for example, high melting metals or high melting metal compounds such as Ta, TaN, TiN and TiSiN and a stack of these. A thickness of the barrier metal film 219 is, for example, 10 nm to 50 nm both inclusive.

Subsequently, a copper film 221 is simultaneously buried in the via hole 211 and the interconnection trench 217 by electroplating. The copper film 221 may be made of the same material as that for the first interconnection 203. A thickness of the copper film 221 is, for example, 300 nm to 2000 nm both inclusive.

Figure 4C:
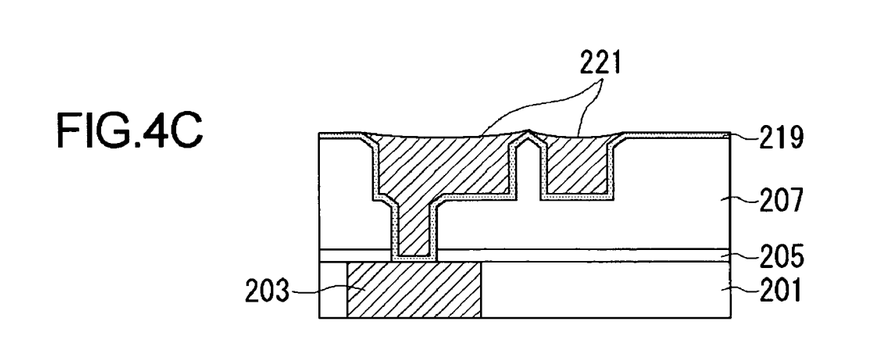
Figure 4D:
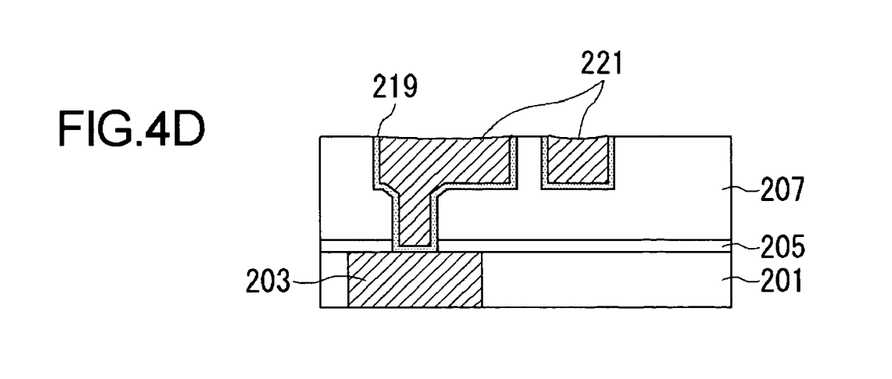

Then, as shown in FIGS. 4C and 4D, the extraneous copper film 221 and barrier metal film 219 formed in the area except the concave are removed by CMP to provide a semiconductor device in which the copper film 221 in the interconnection trench 217 is the second interconnection. The CMP process is conducted in two steps, i. e., the first polishing where polishing is stopped on the surface of the barrier metal film 219 using a large polishing rate ratio between the copper film 221 and the barrier metal film 219 (FIG. 4C)) and the second polishing where the remaining barrier metal film 219 is polished (FIG. 4D). In this embodiment, the second polishing polishes and flattens, along with the barrier metal film 219, the second insulating film 207 and the copper film 221 in the taper formed in the upper part of the interconnection trench 217. Thus, a taper with a small interval between interconnections is removed so that even in a space between fine interconnections, short circuit failure can be effectively prevented.

In the first polishing, a slurry is used, whereby the copper film 221 is efficiently polished. Such a slurry may contain, for example, an oxidizing agent such as $H_2O_2$ and a corrosion inhibitor for a constituent metal in the copper film 221.

In the second polishing, a slurry mainly for mechanical polishing is used for efficient polishing of the barrier metal film 219. Such a slurry may contain, for example, abrasive grains such as silica and a corrosion inhibitor for a constituent in the copper film 221. Since the second insulating film 207 and the copper film 221 are polished along with the barrier metal film 219, a slurry with which a difference in a polishing rate between these films is small is used. It is preferable to use a slurry in which, for example, a polishing rate ratio of the insulating film to the barrier metal is ⅓ to 3 both inclusive. Thus, dishing or erosion can be prevented and the polished surface can be kept flat.

In the second polishing, all tapers in the upper part of the interconnection trench 217 may be polished or some of the tapers may be polished as long as short circuit failure does not occur. Since a taper formed in the upper part of the interconnection trench 217 is often formed to a depth of about 50 nm or more when using a film having a lower dielectric constant such as SiOC as the second insulating film 207, it is particularly effective to polish the second insulating film 207 to 50 nm or more from the upper surface in the second polishing for preventing a parasitic capacitance or short circuit failure.

Thus, in the manufacturing process of this embodiment, a polishing thickness needs to be controlled for efficiently removing a taper in the second polishing. A controlling method will be described.

Figure 7:
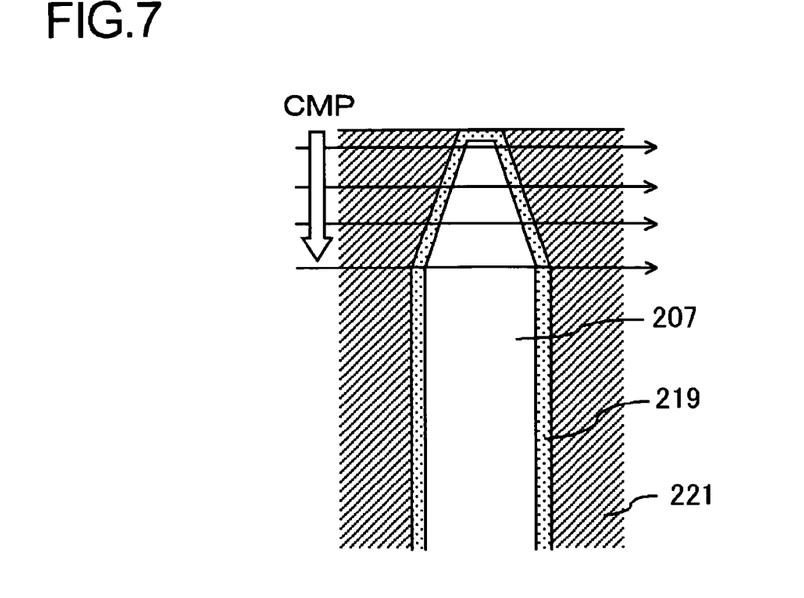
FIG. 7 illustrates a method for controlling a polishing thickness according to an embodiment of this invention.

One of methods for controlling a polishing thickness is measurement of an interval between the upper surfaces of the interconnection trenches 217. The method will be described with reference to FIG. 7. FIG. 7 is an enlarged view of the interval between upper part of the interconnection trench 217 in FIG. 4C.

On a dummy wafer is formed an interconnection pattern in FIG. 4C as shown in FIGS. 3A to 3D and 4A to 4D. Then, varying a polishing time in the second polishing (the arrows in FIG. 7), the interval between the upper surface of interconnection trench 217 in each stage is observed by, for example, SEM (scanning electron microscopy). CD-SEM is preferable because of more precise observation. The polishing conditions can be set such that an interval width between the interconnection trenches 217 is measured and polishing is stopped when the width reaches a given value, to conveniently and efficiently control the thickness of the second insulating film 207 polished in the second polishing.

In setting the polishing conditions, an actual wafer may be used instead of a dummy wafer.

Figure 8:
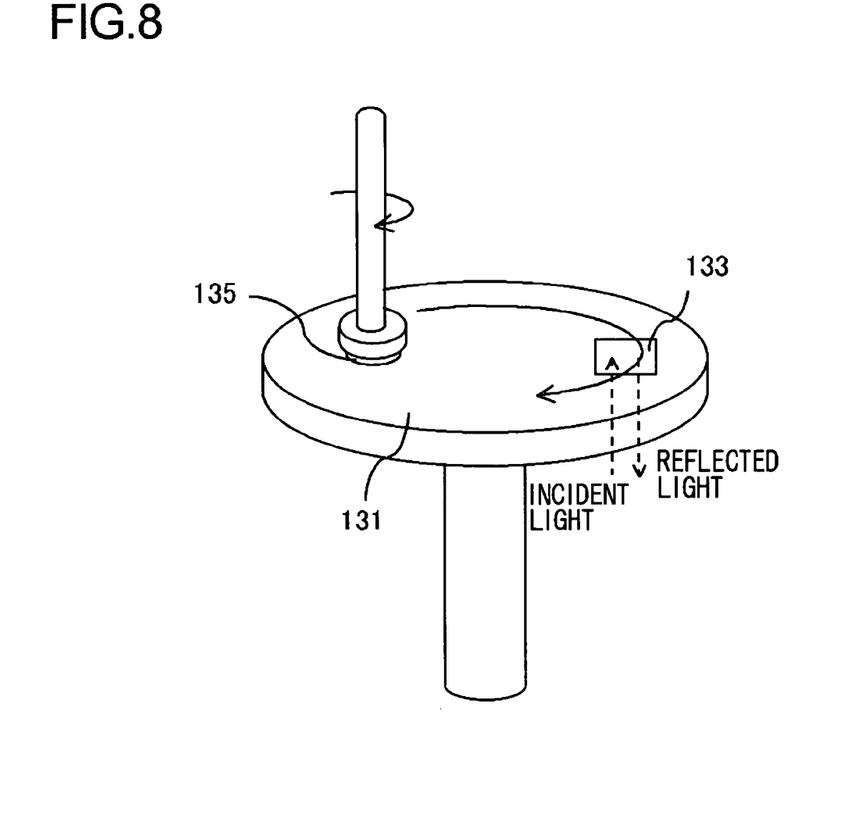
FIG. 8 illustrates a method for controlling a polishing thickness according to an embodiment of this invention.

Alternatively, a polishing thickness can be controlled by a method where a light interference type of thickness meter placed in a CMP apparatus is used as a module for detecting an end point as shown in FIG. 8. For example, a CMP apparatus, ISRM (in Situ Removal Monitor, from Applied Materials Inc.) may be used. In FIG. 8, in polishing pad 131 is formed a transparent window 133, into which a light enters. When a wafer 135 is above over the transparent window 133, a light entering the transparent window 133 is reflected and from interference thus generated, a thickness of the insulating film in the surface of the wafer 135 can be determined. Employing such a configuration allows determination of a thickness when a barrier metal becomes absent in each wafer 135 during CMP. Thus, a thickness of the second insulating film 207 to be polished can be controlled by determining reduction in a thickness and then stopping polishing when the thickness is reduced to a given level.

Second Embodiment

Figure 5A:
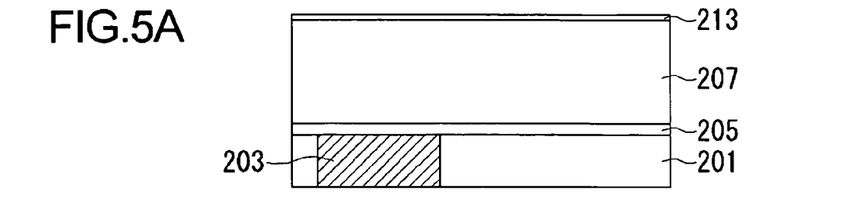
FIGS. 5A to 5D are process cross sections illustrating a process for manufacturing a semiconductor device according to an embodiment of this invention.

FIGS. 5A to 5D and 6A to 6D show a process for manufacturing a semiconductor device according to this embodiment. The procedure to the configuration in FIG. 5A is as described in First Embodiment. FIG. 5A shows that a sacrificial film 213 is formed on the upper surface of the second insulating film 207 in FIG. 3A.

Figure 5B:
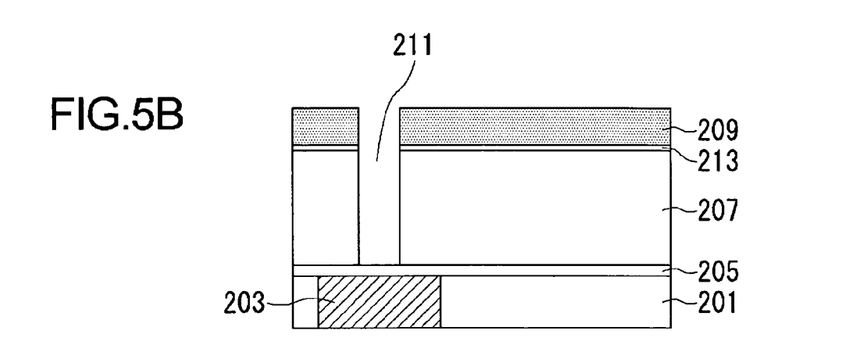
Figure 5C:
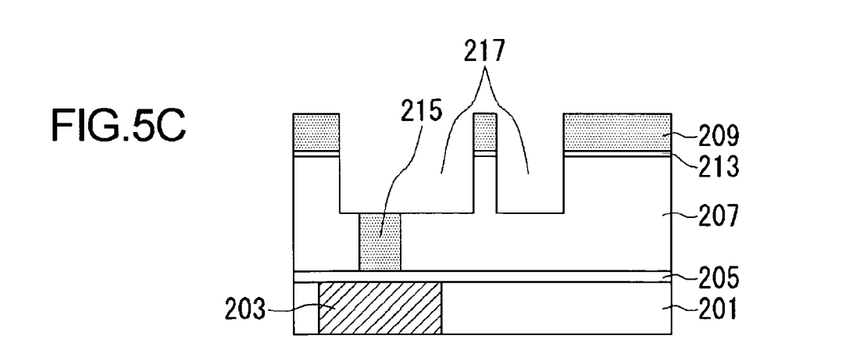
Figure 5D:
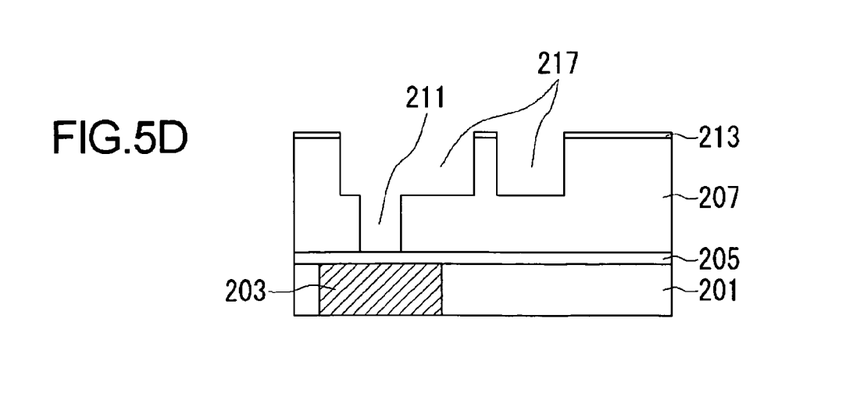
Figure 6A:
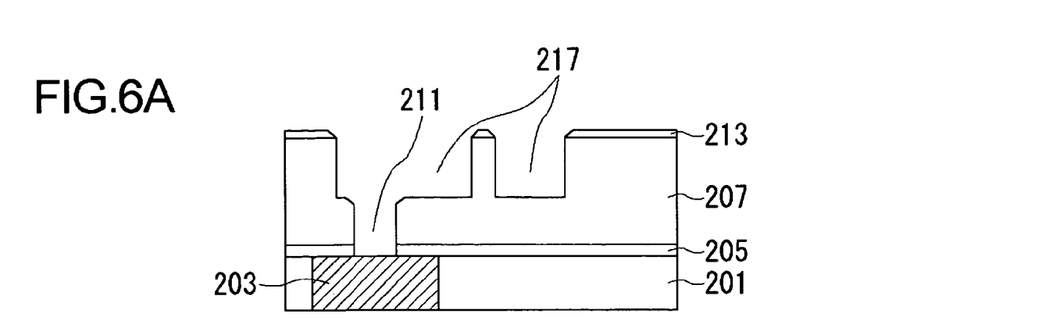
FIGS. 6A to 6D are process cross sections illustrating a process for manufacturing a semiconductor device according to an embodiment of this invention.
Figure 6B:
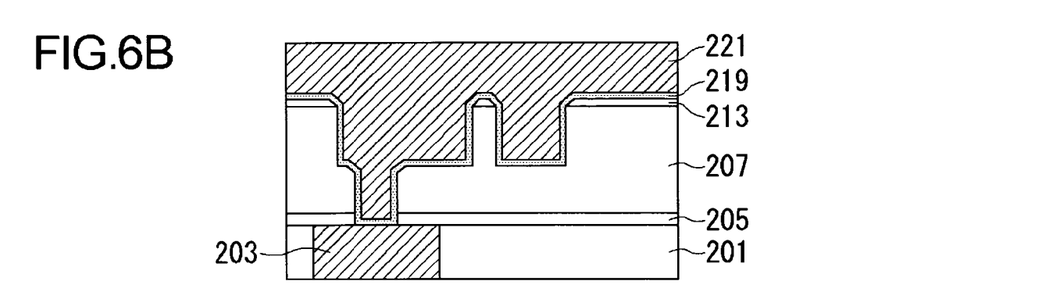

The procedure in FIG. 5B and later is conducted as described in the procedure in FIG. 3B and later in First Embodiment to form a via hole 211 and an interconnection trench 217, then, on a sacrificial film 213 including the interconnection trench 217 and the second insulating film 207, a barrier metal film 219 and a copper film 221 are formed. Thus, the cross section in FIG. 6B is provided.

Figure 6C:
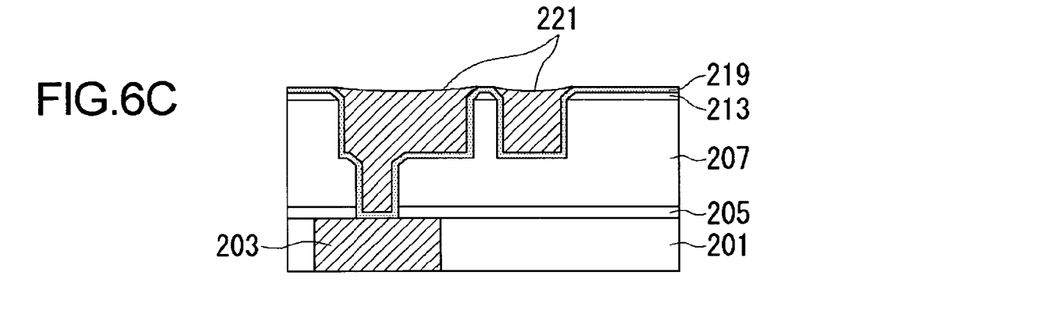
Figure 6D:
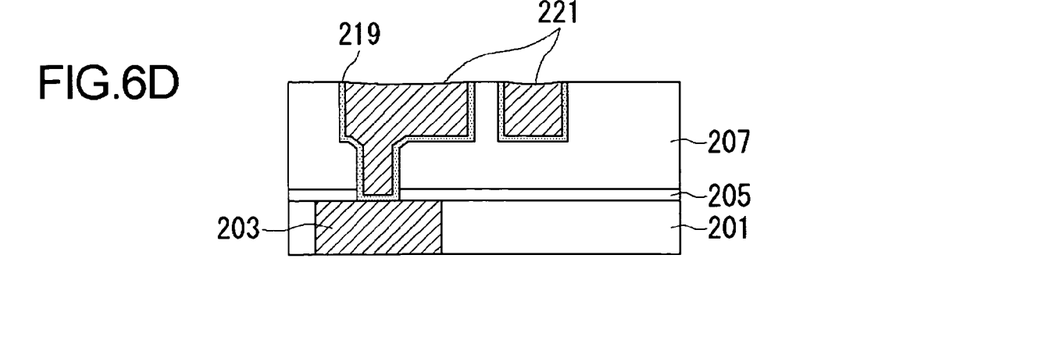

Subsequently, as shown in FIGS. 6C and 6D, two-step CMP is conducted as described in First Embodiment. In the second polishing, the barrier metal film 219 and the tapered sacrificial film 213, the copper film 221 are polished to remove the sacrificial film 213. A polishing level in the second polishing is controlled, for example, as described in First Embodiment. Thus, the semiconductor device in FIG. 6D in which the copper film 221 in the interconnection trench 217 is the second interconnection.

A material for the sacrificial film 213 may be selected from those exhibiting an etching rate equal to or lower than that of the diffusion barrier film 205. A film exhibiting an etching rate lower than that of the diffusion barrier film 205 gives an etching rate lower than that of the second insulating film 207, so that formation of a taper in the upper part of the interconnection trench 217 can be prevented. For example, when using SiC as a material for the diffusion barrier film 205, a film exhibiting an etching rate equal to or lower than that of SiC, such as $SiO_2$, SiN, SiC, SiON and SiCN, can be used. A thickness of the sacrificial film 213 is, for example, 10 nm to 100 nm both inclusive. The film with a thickness of 10 nm or more can suitably prevent taper formation in the upper part of the interconnection trench 217 and thus can reduce a taper size. Furthermore, the film with a thickness of 100 nm or less can be efficiently removed in CMP.

Figure 9:
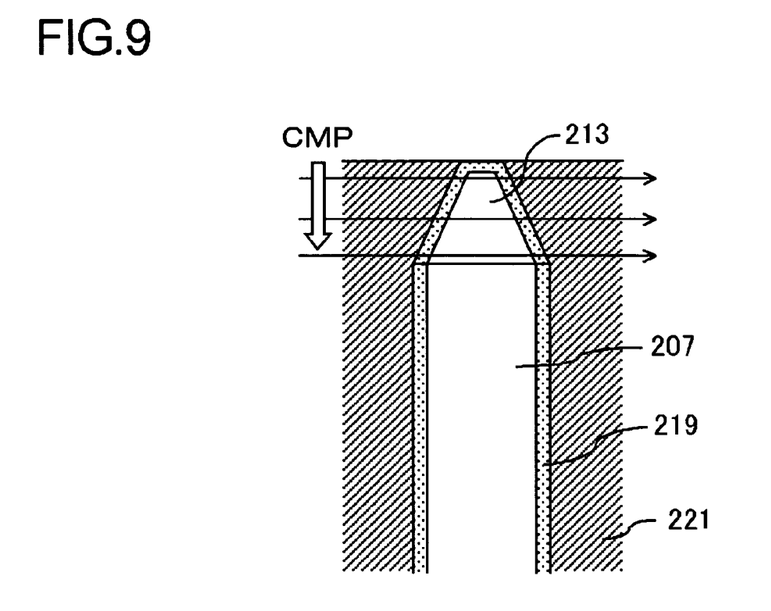
FIG. 9 illustrates a method for controlling a polishing thickness according to an embodiment of this invention.

Thus, in this embodiment, the sacrificial film 213 exhibiting an etching rate lower than that of the second insulating film 207 is formed on the second insulating film 207, so that etching of the corner can be prevented in the upper part of the interconnection trench 217. A taper size formed in the upper part of the interconnection trench 217 can be reduced in comparison with the case where a sacrificial film 213 is not formed. Therefore, as shown in FIG. 9, a polishing level in the second polishing can be reduced in comparison with the case in FIG. 7, for example, 30 nm. FIG. 9 is an enlarged view of the interval between the upper part of the interconnection trench 217 in FIG. 6C.

Thus, in this embodiment, the sacrificial film 213 is formed on the second insulating film 207, to more efficiently remove the taper in the upper part of the interconnection trench 217. Short circuit between interconnections can be, therefore, more effectively prevented. Furthermore, since the sacrificial film 213 is removed by CMP, it is not necessary to take detachment from the second insulating film 207 into account. Thus, we can focus on performance as a sacrificial film 213, resulting in higher freedom in material selection.

Although the present invention has been described by way of exemplary embodiments, it should be understood that many changes and substitutions may be made by those skilled in the art without departing from the spirit and the scope of the present invention which is defined only by the appended claims.

What is claimed is:

1. A method of manufacturing a semiconductor device comprising:
    forming a diffusion barrier film on a semiconductor substrate and then forming an insulating film on the diffusion barrier film, forming a concave in said insulating film by selectively removing said insulating film and said diffusion barrier film, and forming a barrier metal film over the whole surface of said insulating film including said concave, then forming a metal film filling said concave;
    conducting a first polishing over a whole surface of said substrate to form a metal area filled in said concave; and
    conducting a second polishing over said whole surface of said substrate to remove parts of said metal area and of said insulating film;
    wherein the first polishing is stopped on said barrier metal film; and
    wherein said second polishing also removes a part of a normal taper formed in an upper part of said concave.

2. A method of manufacturing a semiconductor device comprising:
    forming a first interconnection of a metal film on a semiconductor substrate;
    forming a diffusion barrier film on the first interconnect;
    forming an insulating film on the diffusion barrier film;
    forming a concave in said insulating film by selectively removing said insulating film and said diffusion barrier film to form a via hole reaching an upper surface of said first interconnection and an interconnection trench connected to said via hole;
    forming a barrier metal film over the whole surface of said insulating film including said concave;
    forming a metal film filling said via hole and said interconnection trench;
    conducting a first polishing over a whole surface of said substrate to form a second interconnection filled in said via hole and said interconnection trench as well as a connection plug; and
    conducting a second polishing over said whole surface of said substrate to remove parts of said second interconnection and of said insulating film;
    wherein the first polishing is stopped on said barrier metal film; and
    wherein said second polishing also removes at least a part of a normal taper formed in an upper part of said interconnection trench.

3. A method of manufacturing a semiconductor device comprising:
    forming a diffusion barrier film on a semiconductor substrate and then forming an insulating film on the diffusion barrier film;
    forming a sacrificial film on said insulating film;
    selectively removing said sacrificial film, said insulating film and said diffusion barrier film to form a concave in said insulating film and forming a barrier metal film over the whole surface of said insulating film including said concave, then forming a metal film filling said concave;
    conducting a first polishing over a whole surface of said substrate to form a metal area filled in said concave; and
    conducting a second polishing over said whole surface of said substrate to remove parts of said metal area and of said insulating film;
    wherein the first polishing is stopped on said barrier metal film; and
    wherein said second polishing also removes said sacrificial film.

4. The method as set forth in claim 3, wherein said step of forming said concave in said insulating film comprises conducting etching under an etching conditions in which said sacrificial film is more slowly etched than said insulating film.

5. A method of manufacturing a semiconductor device comprising:
    forming a first interconnection of a metal film on a semiconductor substrate;
    forming a diffusion barrier film such that it covers said first interconnection;
    forming an insulating film on said diffusion barrier film;
    forming a sacrificial film on said insulating film;
    forming a concave in said insulating film by selectively removing said insulating film and said sacrificial film to form a via hole reaching an upper surface of said first interconnection and an interconnection trench connected to said via hole;
    forming a barrier metal film over the whole surface of said insulating film including said concave;
    forming a metal film filling said via hole and said interconnection trench;
    conducting a first polishing over a surface of said substrate to form a second interconnection and a connection plug filled in said via hole and said interconnection trench; and
    conducting a second polishing over said whole surface of said substrate to remove parts of said second interconnection and of said insulating film;
    wherein the first polishing is stopped on said barrier metal film; and
    wherein said second polishing also removes said sacrificial film on said insulating film.

6. The method as set forth in claim 5, wherein said step of forming said via hole and said interconnection trench in said insulating film comprises conducting etching under an etching conditions in which said sacrificial film is more slowly etched than said insulating film.

7. The method as set forth in claim 1, wherein an information on a polishing rate in said second polishing is obtained and on a basis of said information, an end point of said second polishing is determined.

8. The method as set forth in claim 2, wherein an information on a polishing rate in said second polishing is obtained and on a basis of said information, an end point of said second polishing is determined.

9. The method as set forth in claim 3, wherein an information on a polishing rate in said second polishing is obtained and on a basis of said information, an end point of said second polishing is determined.

10. The method as set forth in claim 4, wherein an information on a polishing rate in said second polishing is obtained and on a basis of said information, an end point of said second polishing is determined.

11. The method as set forth in claim 5, wherein an information on a polishing rate in said second polishing is obtained and on a basis of said information, an end point of said second polishing is determined.

12. The method as set forth in claim 6, wherein an information on a polishing rate in said second polishing is obtained and on a basis of said information, an end point of said second polishing is determined.

13. The method as set forth in claim 1, wherein a thickness of said insulating film polished along with said metal area is observed to determine an end point of said second polishing.

14. The method as set forth in claim 2, wherein a thickness of said insulating film polished along with said second interconnection is observed to determine an end point of said second polishing.

15. The method as set forth in claim 3, wherein a thickness of said insulating film polished along with said metal area is observed to determine an end point of said second polishing.

16. The method as set forth in claim 4, wherein a thickness of said insulating film polished along with said metal area is observed to determine an end point of said second polishing.

17. The method as set forth in claim 5, wherein a thickness of said insulating film polished along with said second interconnection is observed to determine an end point of said second polishing.

18. The method as set forth in claim 6, wherein a thickness of said insulating film polished along with said second interconnection is observed to determine an end point of said second polishing.

19. The method as set forth in claim 1, wherein the step of conducting the first polishing comprises using a slurry containing an oxidizing agent.

20. The method as set forth in claim 1, wherein the step of conducting the second polishing comprises using a slurry containing abrasive grains and a corrosion inhibitor.

* * * * *